(12) United States Patent
Yano et al.

(10) Patent No.: US 6,232,132 B1
(45) Date of Patent: May 15, 2001

(54) METHOD FOR POLARIZATION TREATMENT OF PIEZOELECTRIC/ELECTROSTRICTIVE FILM TYPE CHIP

(75) Inventors: Shinsuke Yano; Toshihisa Mizutani; Masato Komazawa, all of Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/198,987

(22) Filed: Nov. 23, 1998

(30) Foreign Application Priority Data

Nov. 26, 1997 (JP) .................................... 9-324050

(51) Int. Cl.⁷ .................................................. H01L 21/00
(52) U.S. Cl. ................... 438/3; 310/366; 347/68; 347/71; 347/72
(58) Field of Search ................. 438/51, 106, 29, 438/3; 310/366, 363; 347/72, 68, 71

(56) References Cited

U.S. PATENT DOCUMENTS

| | | | |
|---|---|---|---|
| 4,340,786 | 7/1982 | Tester | 179/110 A |
| 4,612,145 | 9/1986 | Keith et al. | 264/22 |
| 5,266,964 | * 11/1993 | Takahashi et al. | 346/1.1 |

OTHER PUBLICATIONS

Patent Abstracts of Japan, vol. 1997, No. 10, Oct. 31, 1997 & JP 09 148647 A (Toyota Motor Corp.), Jun. 6, 1997.
Patent Abstracts of Japan, vol. 010, No. 367 (E–462), Dec. 9, 1986 & JP 61 161779 A (Toshiba Ceramics Co. Ltd.), Jul. 22, 1986.

* cited by examiner

*Primary Examiner*—Charles Bowers
*Assistant Examiner*—Hsien-Ming Lee
(74) *Attorney, Agent, or Firm*—Burr & Brown

(57) ABSTRACT

A method for polarization treatment of a piezoelectric/electrostrictive film type chip, comprising: providing a piezoelectric/electrostrictive film type chip comprising a plurality of piezoelectric/electro-strictive film type elements each having a piezoelec-tric/electrostrictive section constituted by a thin diaphragm, a lower electrode formed on the diaphragm, a piezoelectric/electrostrictive layer formed on the lower electrode, and an upper electrode formed on the piezoelectric/electrostrictive layer, dividing the plurality of piezoelectric/electrostrictive film type elements into two or more element groups, and subjecting each element group to a polarization treatment. The chip after the polarization treatment is low in dielectric breakdown and can be used as a reliable piezoelectric/electrostrictive film type chip.

3 Claims, 2 Drawing Sheets

Fig. 2 - Prior Art
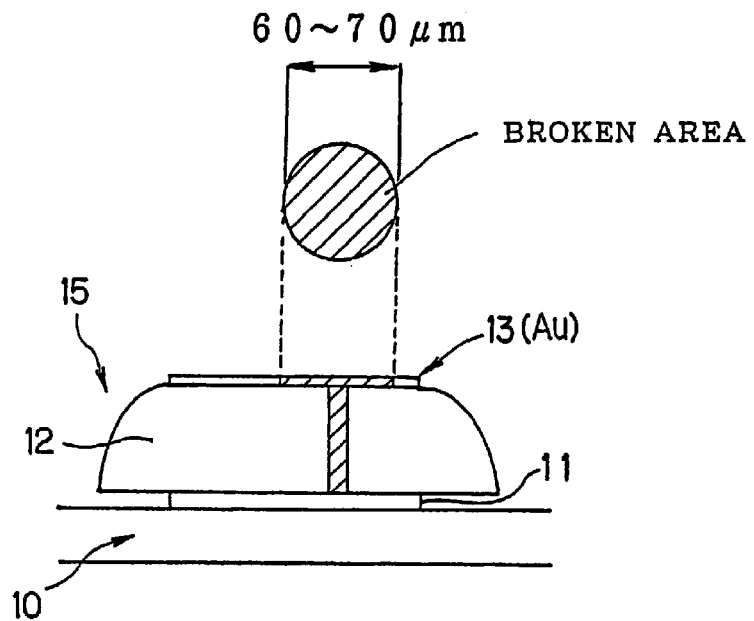
Fig. 3 - Prior Art
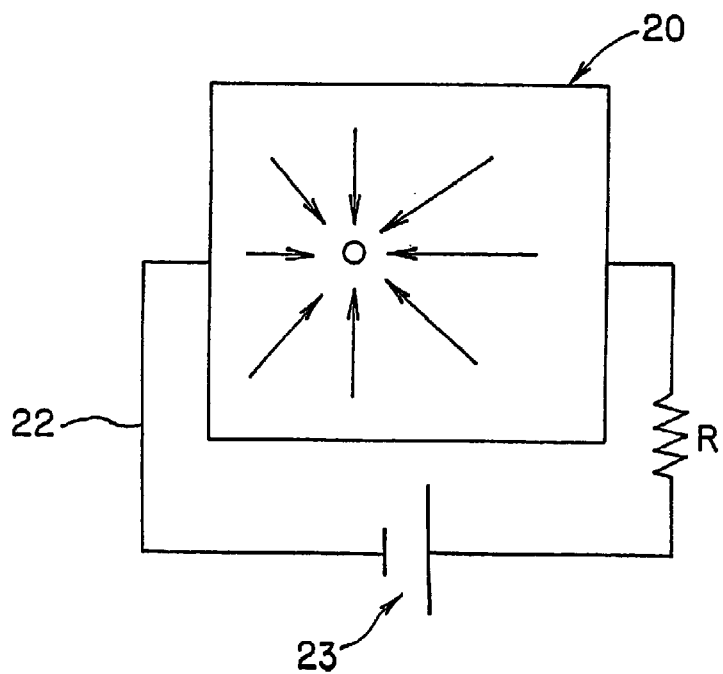

METHOD FOR POLARIZATION TREATMENT OF PIEZOELECTRIC/ ELECTROSTRICTIVE FILM TYPE CHIP

BACKGROUND OF THE INVENTION (1) Field of the Invention

The present invention relates to a method for polarization treatment of a piezoelectric/electrostrictive film type chip which is integrated piezoelectric/electrostrictive film type elements.

(2) Description of Prior Art

In recent years, there has been known, as a mechanism for increasing the pressure inside a pressure room formed in a material, a piezoelectric/electrostrictive film type element which is fixed on the wall of the pressure room and which can change the volume of the pressure room owing to the displacement of the piezoelectric/electrostrictive section. Such a piezoelectric/electrostrictive film type element is being used, for example, as the ink pump of a print head used in an ink jet printer.

The print head is formed by integrating a plurality of piezoelectric/electrostrictive film type elements to produce an piezoelectric/electrostrictive film type chip and joining the chip with an ink nozzle member. Prior to the joining, the piezoelectric/electrostrictive film type chip is generally subjected to a polarization treatment to polarize it to a given direction.

FIG. 2 is a sectional view showing part of a piezoelectric/electrostrictive film type element. On a diaphragm 10 are laminated a lower electrode 11, a piezoelectric/electrostrictive layer 12 and an upper electrode 13 in this order, whereby a piezoelectric/electrostrictive film type element 15 is constituted. Such a piezoelectric/electrostrictive film type element 15 is integrated by, for example, 66 elements, whereby a piezoelectric/electrostrictive film type chip 20 as shown in FIG. 3 is formed. In the piezoelectric/electrostrictive film type chip 20, the piezoelectric/electrostrictive layers 12 of the piezoelectric/electrostrictive film type elements 15 are formed each independently, but the upper electrodes 13 and the lower electrodes 11 are respectively connected between the piezoelectric/electrostrictive film type elements 15.

The polarization treatment to such a piezoelectric/electrostrictive film type chip 20 has been conducted by, as shown in FIG. 3, forming a circuit 22 for polarization treatment between the upper electrodes 13 and the lower electrodes 11 of the piezoelectric/electrostrictive film type elements 15 and applying a given voltage to the circuit. In FIG. 3, R is a load resistance used in the circuit 22 for polarization treatment, and 23 is an electric source.

When the piezoelectric/electrostrictive film type chip 20 is subjected to a polarization treatment as above, however, dielectric breakdown arises in the chip 20 when the piezoelectric/electrostrictive layer 12 has defects. When the defects are large and the dielectric breakdown is high, those piezoelectric/electrostrictive film type elements having such defects become unusable. A study by the present inventor indicated that when the dielectric breakdown is low, the piezoelectric/electrostrictive film type elements showing such dielectric breakdown are hardly affected in the performance and are sufficiently usable as piezoelectric/electrostrictive film type elements.

SUMMARY OF THE INVENTION

The present invention has been completed based on the above finding. The object of the present invention is to provide a method for polarization treatment of a piezoelectric/electrostrictive film type chip, wherein the chip comprising a plurality of piezoelectric/electrostrictive film type elements is divided into two or more element groups and each group is subjected to a polarization treatment, thereby allowing the elements to have low dielectric breakdown and be usable as reliable elements.

According to the present invention, there is provided a method for polarization treatment of a piezoelectric/electrostrictive film type chip, comprising:

providing a piezoelectric/electrostrictive film type chip comprising a plurality of piezoelectric/electrostrictive film type elements each having a piezoelectric/electrostrictive section constituted by a thin diaphragm, a lower electrode formed on the diaphragm, a piezoelectric/electrostrictive layer formed on the lower electrode, and an upper electrode formed on the piezoelectric/electrostrictive layer, dividing the plurality of piezoelectric/electrostrictive film type elements into two or more element groups, and subjecting each element group to a polarization treatment.

In the above method, it is preferred that a circuit for polarization treatment is formed for each element group so as to contain a resistance R which is set to be smaller than the insulation resistance of the element group and larger than the resistance of the element group when short-circuiting takes place. The resistance R is preferably not larger than $1/10$ of the insulation resistance of the element group and at least 10 times the resistance of the element group when short-circuiting takes place; the resistance R is more preferably $1/10$ to $1/100$ of the insulation resistance of the element group and 10 to 100 times the resistance of the element group when short-circuiting takes place.

BRIEF DESCRIPTION OF THE DRAWINGS

FIG. 2 is a sectional drawing showing part of a piezoelectric/electrostrictive film type element.

FIG. 3 is a drawing showing an example of conventional methods for polarization treatment.

DESCRIPTION OF THE PREFERRED EMBODIMENTS

Figure 1:
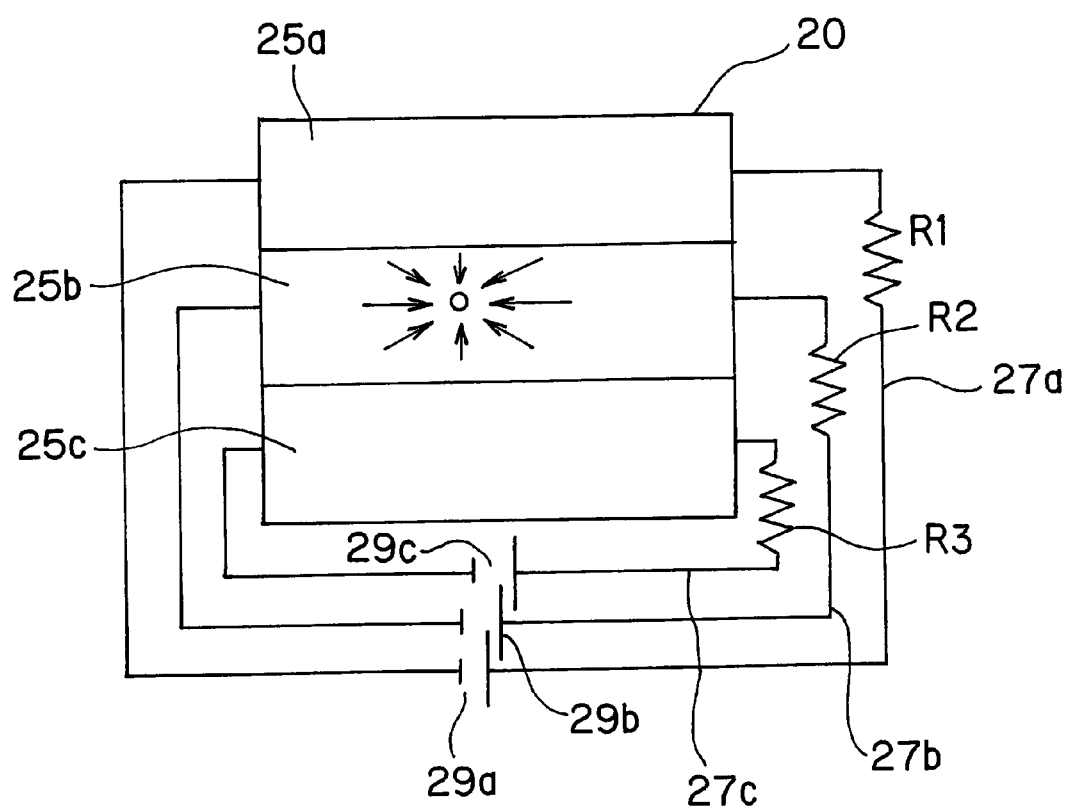
FIG. 1 is a drawing showing an example of the method for polarization treatment according to the present invention.

In the method for polarization treatment according to the present invention, a piezoelectric/electrostrictive film type chip comprising a large number of piezoelectric/electrostrictive film type elements is divided into two or more element groups; a circuit for polarization treatment is formed for each element group; and each element group is subjected to a polarization treatment.

By conducting a polarization treatment as above, the polarization-broken area in the upper electrode formed during dielectric breakdown is made very small and it is possible to obtain a piezoelectric/electrostrictive film type chip which has no performance problem and which can be used reliably.

In an ordinary method for polarization treatment as shown in FIG. 3, however, large defects appear owing to the current fed from an electric source 23 when dielectric breakdown takes place.

In order to decrease the current level, a resistance R is used in the circuit for polarization treatment. Since each piezoelectric/electrostrictive film type element functions as a condenser, when dielectric breakdown takes place, charges proportional to the breakdown voltage are stored in the upper electrode and the lower electrode; a current is fed by the charges; resultantly, it is impossible to make the defects caused by dielectric breakdown, smaller than a certain size. Needless to say, there are cases that the defects caused by dielectric breakdown become small when dielectric breakdown occurs at a low voltage used in the course of voltage increase to a polarization voltage.

For the reasons mentioned above, in order to reduce the defects caused by dielectric breakdown, it is necessary to reduce the amount of electricity stored in the piezoelectric/electrostrictive film type element which is a condenser. To achieve this, it is necessary to reduce the capacity of the condenser.

In the present method for polarization treatment, a large number of piezoelectric/electrostrictive film type elements constituting a piezoelectric/electrostrictive film type chip are divided into two or more element groups, and the element groups are each connected in parallel and independently polarized. Therefore, the capacity of the chip becomes the total of the capacities of the element groups. Thus, by dividing a plurality of piezoelectric/electrostrictive film type elements into two or more element groups and subjecting each element group to a polarization treatment, as in the present method, the amount of electricity which is stored in the condenser and which flows through the circuit for polarization treatment at the time of dielectric breakdown, can be reduce.

The present method is described below with reference to the accompanying drawings.

FIG. 1 is a drawing showing an example of the method for polarization treatment according to the present invention. The piezoelectric/electrostrictive film type elements 15 formed in a piezoelectric/electrostrictive film type chip 20 are divided into three element groups 25a, 25b and 25c. For the element groups 25a, 25b and 25c are formed, respectively, circuits 27a, 27b and 27c for polarization treatment, each containing load resistances R1, R2 and R3. Incidentally, 29a, 29b and 29c are, respectively, electric sources for the circuits 27a, 27b and 27c.

As above, in the present method of the FIG. 1, the piezoelectric/electrostrictive film type elements of piezoelectric/electrostrictive film type chip are divided into three element groups and each element group is subjected to a polarization treatment. As a result, the polarization-broken area in the upper electrode formed during dielectric breakdown can be made very small.

In the present method, the number of element groups formed by dividing the piezoelectric/electrostrictive film type elements of piezoelectric/electrostrictive film type chip is not particularly restricted as long as it is two or more. The number is preferably three or more, and more preferably three to four in view of the reduction in size of polarization-broken area, the complexity of apparatus needed for polarization treatment, and the cost of polarization treatment.

The resistance R contained in each circuit for polarization treatment is preferably smaller than the insulation resistance of the element group and larger than the resistance of the element group when short-circuiting takes place. The resistance R is more preferably $1/10$ to $1/100$ of the insulation resistance of the element group and 10 to 100 times the resistance of the element group when short-circuiting takes place.

The reason is as follows. If the resistance R is larger than the insulation resistance of each element group, the polarization voltage applied is consumed largely by the resistance R, and no intended voltage is applied to each element (that is, no sufficient polarization takes place) or dielectric breakdown occurs at an operational voltage of the chip during actual use of the chip. If the resistance R is smaller than the resistance of the element group when short-circuiting takes place, it is difficult to sufficiently decrease the defects formed by the current fed from an electric source during dielectric breakdown, and there arise cases that the polarization by division into element groups is unable to make small the defects.

The effects of the present method are explained by the following Example.

EXAMPLE

A piezoelectric/electrostrictive film type chip 20 comprising 66 piezoelectric/electrostrictive film type elements 15 was prepared. Each piezoelectric/electrostrictive film type element 15 had a constitution as shown in FIG. 2 and contained an upper electrode 13 consisting of a gold (Au) electrode of given width and a lower electrode 11.

As shown in FIG. 1, the 66 piezoelectric/electrostrictive film type elements 15 were divided into three element groups 25a, 25b and 25c each consisting of 22 elements. For the element groups 25a, 25b and 25c were formed, respectively, circuits 27a, 27b and 27c for polarization treatment each containing load resistances R1, R2 and R3.

The load resistances R1, R2 and R3 were each 5 k$\Omega$. A given voltage was applied to each circuit from electric sources 29a, 29b and 29c, whereby a polarization treatment was conducted.

As a result, the polarization-broken area of the upper electrode 13 formed during dielectric breakdown was very small. The diameter of polarization breakage was 30 $\mu$m or smaller.

Similar results were obtained also when the load resistances R1, R2 and R3 were each 200 k$\Omega$ or 1 M$\Omega$.

Comparative Example

As in the above Example, a piezoelectric/electrostrictive film type chip 20 comprising 66 piezoelectric/electrostrictive film type elements 15 was prepared. Each piezoelectric/electrostrictive film type element 15 had a constitution as shown in FIG. 2 and contained an upper electrode 13 consisting of a gold (Au) electrode of given width and a lower electrode 11.

For this piezoelectric/electrostrictive film type chip 20 was formed, as shown in FIG. 3, a circuit 22 for polarization treatment containing a resistance R. The resistance R was 5 k$\Omega$. A given voltage was applied to the circuit by an electric source 23 to conduct a polarization treatment. As a result, the polarization-broken area of the upper electrode 13 formed during dielectric breakdown was large. The diameter of polarization breakage was 60 to 70 $\mu$m. Similar results were obtained also when the load resistance R was 200 k$\Omega$ or 1 M$\Omega$.

What is claimed is:

1. A method for polarization treatment of a piezoelectric/electrostrictive film type chip, comprising:
    providing a piezoelectric/electrostrictive film type chip comprising a plurality of piezoelectric/electrostrictive film type elements each having a piezoelectric/electrostrictive section constituted by a diaphragm, a lower electrode formed on the diaphragm, a piezoelectric/electrostrictive layer formed on the lower electrode, and an upper electrode formed on the piezoelectric/electrostrictive layer, dividing the plurality of piezoelectric/electrostrictive film type elements into two or more element groups, and subjecting each element group to a polarization treatment.

2. A method according to claim 1, wherein a circuit for polarization treatment is formed for each element group so as to contain a resistance R which is set to be smaller than the insulation resistance of the element group and larger than the resistance of the element group when short-circuiting takes place.

3. A method according to claim 2, wherein the resistance R is not larger than $\frac{1}{10}$ of the insulation resistance of the element group and at least 10 times the resistance of the element group when short-circuiting takes place.

* * * * *